US009584788B1

(12) United States Patent
Chen et al.

(10) Patent No.: US 9,584,788 B1
(45) Date of Patent: *Feb. 28, 2017

(54) VIDEO STORAGE AND VIDEO PLAYING

(71) Applicant: International Business Machines Corporation, Armonk, NY (US)

(72) Inventors: David S. C. Chen, Taipei (TW); Hsiao-Yung Chen, New Taipei (TW); Wei-Te Chiang, Taipei (TW); En-Shuo Hsu, Taipei (TW); Yu-Hsing Wu, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/210,945

(22) Filed: Jul. 15, 2016

Related U.S. Application Data

(63) Continuation of application No. 15/016,664, filed on Feb. 5, 2016, which is a continuation of application No. 14/887,365, filed on Oct. 20, 2015.

(51) Int. Cl.
H04N 9/804 (2006.01)
H04N 9/87 (2006.01)
(Continued)

(52) U.S. Cl.
CPC ............. *H04N 9/8045* (2013.01); *H04N 9/87* (2013.01); *H04N 19/159* (2014.11);
(Continued)

(58) Field of Classification Search
CPC ........ H04N 5/91; H04N 5/765; H04N 19/172; H04N 19/436; H04N 19/61; H04N 19/159;
(Continued)

(56) References Cited

U.S. PATENT DOCUMENTS 8,233,621 B2 * 7/2012 Li ........................ H04N 7/1675
375/240.16
8,346,065 B2 * 1/2013 Grigorian ................ H04N 5/76
386/326
(Continued)

FOREIGN PATENT DOCUMENTS

CN 103020981 A 4/2013
CN 103780877 A 5/2014
(Continued)

OTHER PUBLICATIONS

Chen et al. "Video Storage and Video Playing", U.S. Appl. No. 14/887,365, filed Oct. 20, 2015, 40 pages.
(Continued)

*Primary Examiner* — Brian Yenke
*Assistant Examiner* — Sean Haiem
(74) *Attorney, Agent, or Firm* — Christopher McLane; Daniel R. Simek

(57) ABSTRACT

In an approach for storing frames of a video, a computer divides a video into one or more frames. The computer identifies a frame type associated with an individual frame within the divided one or more frames, wherein the identified frame type includes one of the following: an I-frame, a B-frame, and a P-frame. The computer stores the individual frame within a corresponding storage location based on the associated identified frame type.

1 Claim, 6 Drawing Sheets

(51) Int. Cl.
*H04N 19/159* (2014.01)
*H04N 19/423* (2014.01)
*H04N 19/46* (2014.01)
*H04N 19/52* (2014.01)
*H04N 19/65* (2014.01)

(52) U.S. Cl.
CPC ........... *H04N 19/423* (2014.11); *H04N 19/46* (2014.11); *H04N 19/52* (2014.11); *H04N 19/65* (2014.11)

(58) Field of Classification Search
CPC ...... H04N 19/423; H04N 19/46; H04N 19/52; H04N 19/65; H04N 19/40; H04N 21/23; H04N 21/23608; H04N 21/432; H04N 21/433; H04N 21/4402; H04N 9/8045; H04N 9/87; G11B 27/3081; G11C 11/14
See application file for complete search history.

(56) References Cited

U.S. PATENT DOCUMENTS

| | | | | |
|---|---|---|---|---|
| 8,855,466 | B2* | 10/2014 | Thornberry | G11B 27/034 386/239 |
| 2003/0140347 | A1* | 7/2003 | Varsa | H04N 21/236 725/90 |
| 2005/0094808 | A1* | 5/2005 | Pedlow, Jr. | G11B 27/005 380/200 |
| 2006/0047967 | A1* | 3/2006 | Akhan | H04N 5/76 713/176 |
| 2008/0063359 | A1* | 3/2008 | Grigorian | H04N 5/76 386/326 |
| 2008/0152014 | A1* | 6/2008 | Schreier | H04N 19/172 375/240.21 |
| 2010/0002875 | A1* | 1/2010 | Li | H04N 7/1675 380/42 |
| 2011/0083156 | A1* | 4/2011 | Martinez | H04N 7/17318 725/118 |
| 2013/0294743 | A1* | 11/2013 | Thornberry | G11B 27/034 386/239 |

FOREIGN PATENT DOCUMENTS

| | | |
|---|---|---|
| CN | 103813174 A | 5/2014 |
| CN | 105227991 A | 1/2016 |

OTHER PUBLICATIONS

Chen et al. "Video Storage and Video Playing", U.S. Appl. No. 15/016,664, filed Feb. 5, 2016, 36 pages.

Appendix P, List of IBM Patents or Patent Applications Treated as Related, 2 pages, dated Aug. 16, 2016.

Mell et al., "The NIST Definition of Cloud Computing", Recommendationsof theNational Institute of Standards and Technology, NIST Special Publication 800-145, Computer Security DivisionInformation Technology Laboratory, National Institute of Standards and Technology, Gaithersburg, MD 20899-8930, Sep. 2011, 7 pages.

\* cited by examiner

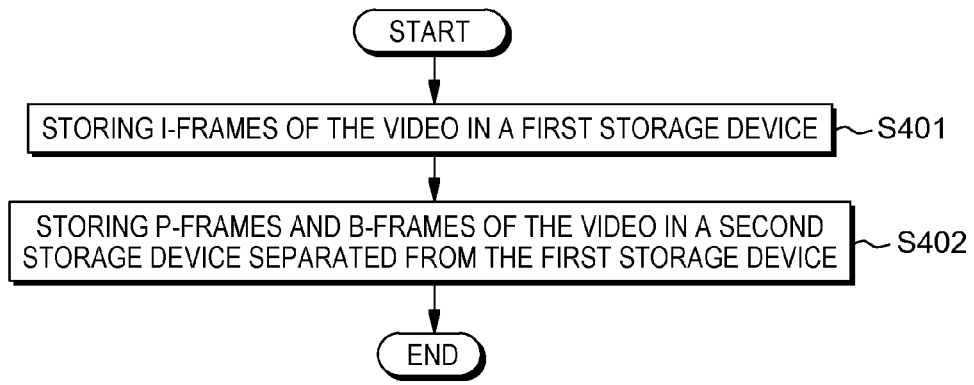
FIG. 4
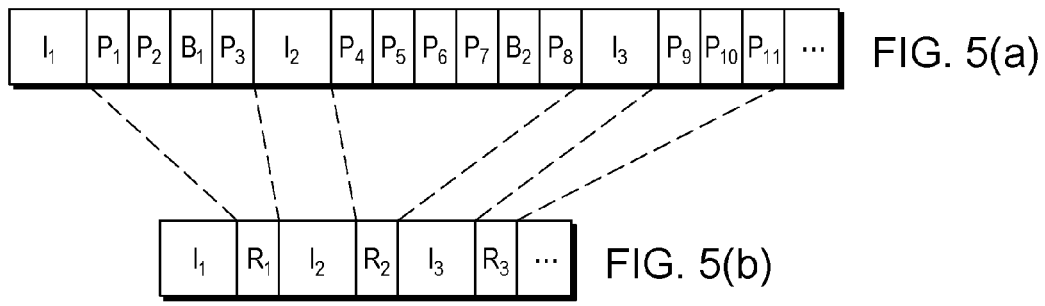
FIG. 5(a)
FIG. 5(b)
| REFERENCE INFORMATION | P-FRAMES & B-FRAMES |
|---|---|
| $R_1$ | $P_1, P_2, B_1, P_3$ |
| $R_2$ | $P_4, P_5, P_6, P_7, B_2, P_8$ |
| $R_3$ | $P_9, P_{10}, P_{11}$ |
| ... | ... |
FIG. 5(c)

VIDEO STORAGE AND VIDEO PLAYING

BACKGROUND

The present invention relates generally to the field of video processing, and more particularly to storing a video and playing the video.

Video provides an electronic medium for recording, copying, playback, broadcasting, and displaying moving visual media. Digital video represents the data for moving visual images in the form of encoded digital data that is discontinuous. Digital video utilizes a video coding format (e.g., video compression format) that is a content representation format for storage or transmission of digital video content (e.g., data file, bit stream, etc.). Video compression utilizes coding techniques to reduce redundancy in video data such as a series of still image frames. The sequence of the frames contain spatial and temporal redundancies that video compression algorithms attempt to eliminate or code in a smaller size. One of the most powerful techniques for compressing video is inter-frame compression. Inter-frame compression uses one or more earlier or later frames in a sequence to compress the current frame while intraframe compression only uses the current frame (i.e. image compression).

With inter frame prediction, an inter coded frame is divided into blocks known as macro blocks. Rather than encoding the raw pixel values for each block, an encoder searches within a previously encoded frame, or reference frame for a block similar to the one being encoding. When the encoder locates a similar block, the current block is encoded by a motion vector, which points to the position of the matching block at the reference frame and calculates the differences (e.g., prediction error) between the two blocks that need to be transformed. The prediction error is sent to a decoder in order to recover the raw pixels of the encoded block during viewing. When a suitable match is not found, or when a possible reference frame is also encoded using inter frame prediction, in order to synchronize the video stream and reduce the chances of propagating errors in subsequent blocks, an I-frame is used which is intra coded and does not need additional information to be decoded.

SUMMARY

Aspects of the present invention disclose a method, computer program product, and system for storing frames of a video. The method includes one or more computer processors dividing a video into one or more frames. The method further includes one or more computer processors identifying a frame type associated with an individual frame within the divided one or more frames, wherein the identified frame type includes one of the following: an I-frame, a B-frame, and a P-frame. The method further includes one or more computer processors storing the individual frame within a corresponding storage location based on the associated identified.

BRIEF DESCRIPTION OF THE DRAWINGS

FIG. 4 illustrates a flowchart of a method for storing a video, in accordance with an embodiment of the present invention;

FIG. 5(*a*) illustrates a common storage format of I-, P- and B-frames in a video, in accordance with an embodiment of the present invention;

FIG. 5(*b*) illustrates an exemplary storage manner, in accordance with an embodiment of the present invention;

FIG. 5(*c*) illustrates a mapping between the respective reference information and P- and B-frames, in accordance with an embodiment of the present invention;

DETAILED DESCRIPTION

Figure 1:
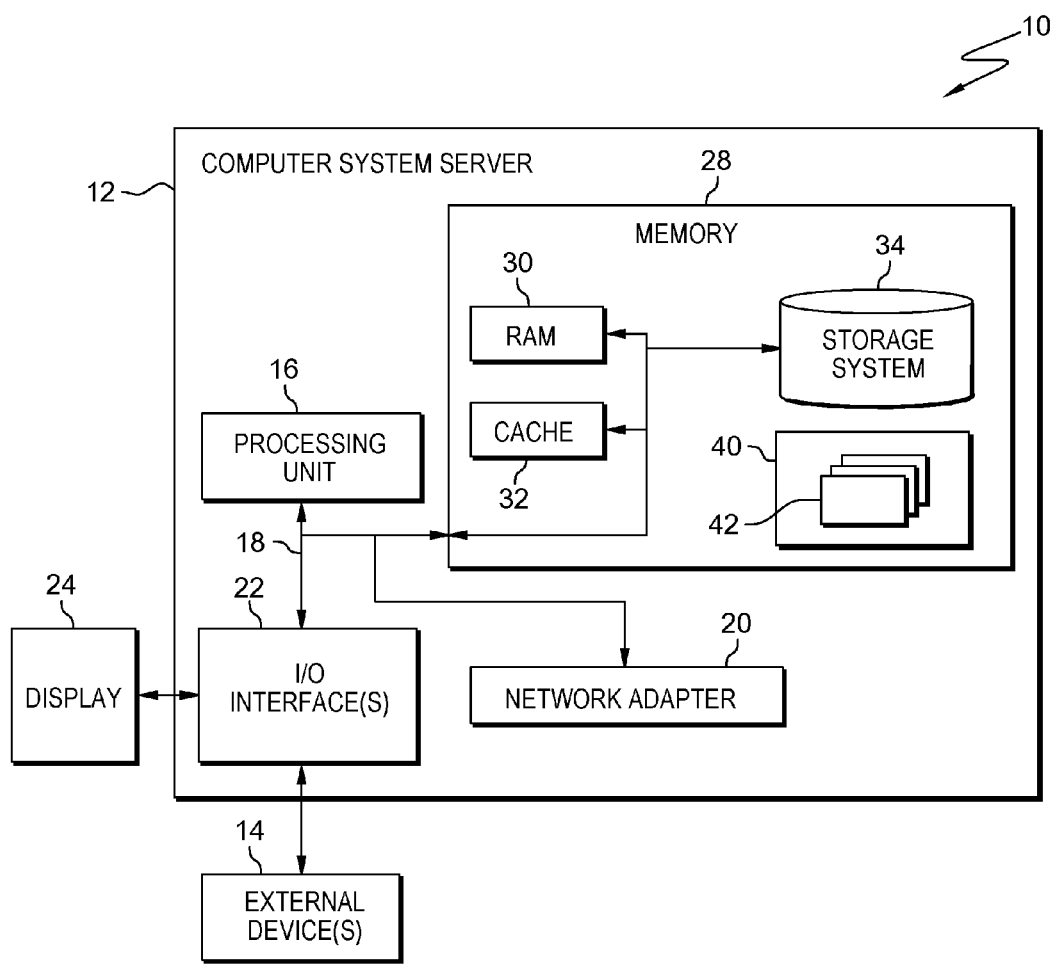
FIG. 1 depicts a cloud computing node, in accordance with an embodiment of the present invention.

With a global average connection speed exceeding 4 Mbits/s and increased access to the Internet, more and more video providers and/or online media sharing platforms are available on the Internet. Embodiments of the present invention recognize that with the increase in video providers and/or online media sharing platforms, an increase in online piracy (e.g., the illegal copying of copyrighted materials from the Internet) may occur and that protecting the security (e.g., viewing) of a video from unauthenticated users is important. While embodiments of the present invention recognize using a new data type; adding metadata or tags to declare a copyright; and encrypting the entire video, assist in ensuring the security of the video, the methods are not applicable for controlling all types of online video streaming and make playing the video using typical media players difficult for users. Embodiments of the present invention also recognize that online video buffering may incur long wait times due to Internet traffic and/or transferring a large file such as HD (High Definition) file over video streaming and degrades the viewing experience of the users.

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough understanding of the present disclosure, and to convey the scope of the present disclosure to those skilled in the art.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
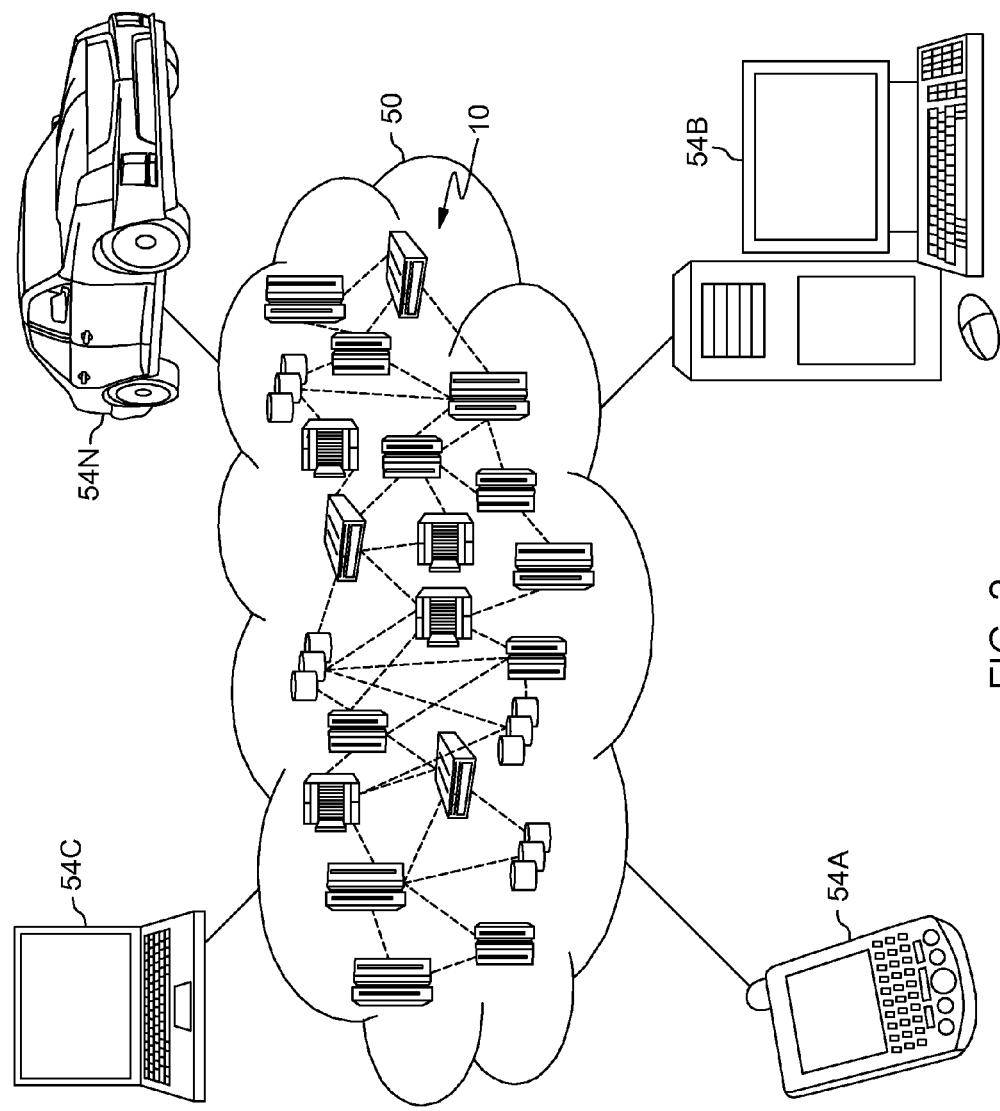
FIG. 2 depicts a cloud computing environment, in accordance with an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that cloud computing nodes 10 and cloud computing environment 50 can communicate with any type of computerized device over any type of network and/or network addressable connection (e.g., using a web browser).

Figure 3:
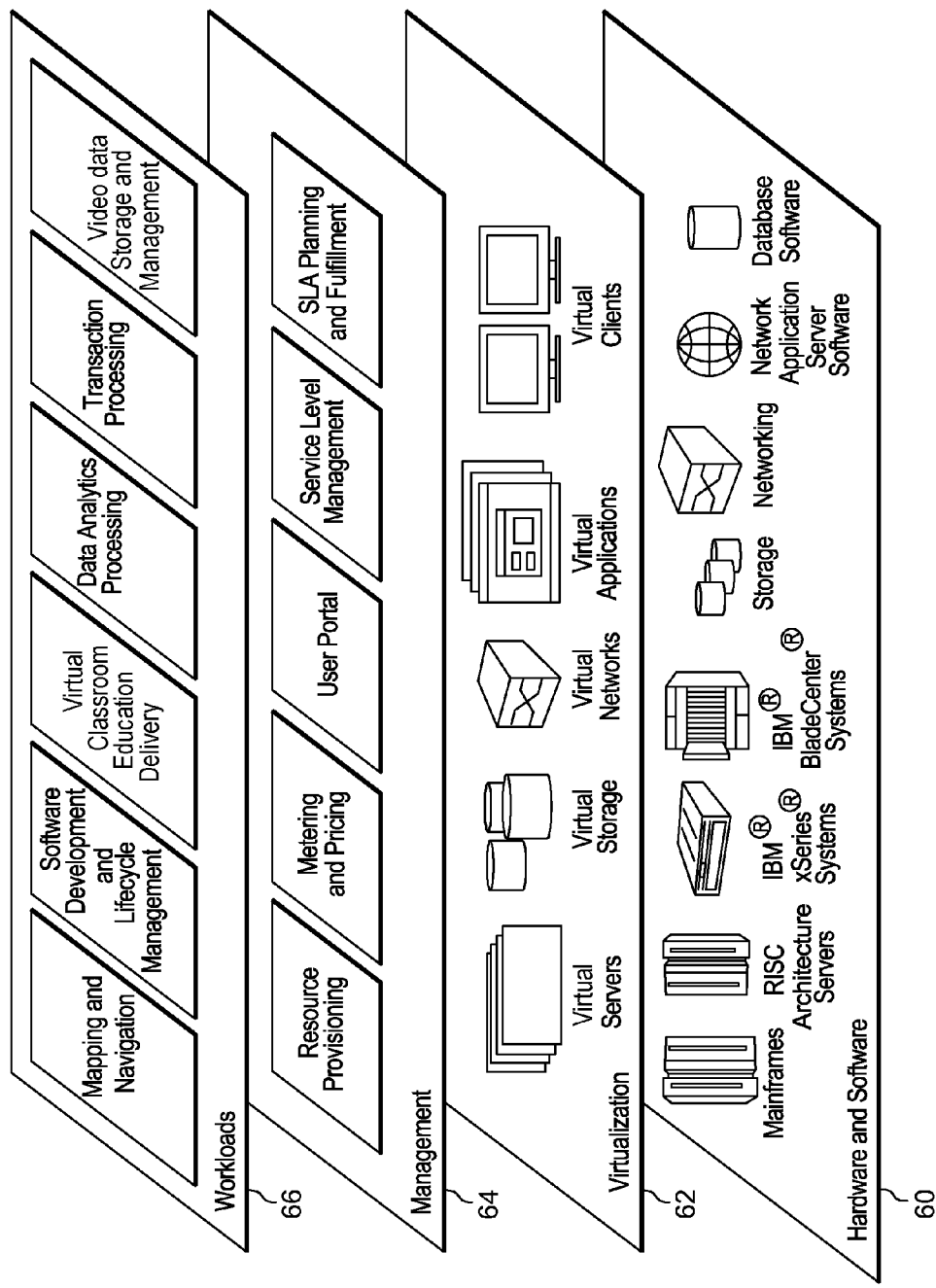
FIG. 3 depicts abstraction model layers, in accordance with an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; transaction processing; and video data storage and management.

With reference now to FIG. 4, the method for storing the video, in accordance with an embodiment of the present invention, will be described in detail. First, the basic idea of the present disclosure and technical terms involved will be briefly described.

In video compression and video encoding processes, video frames may be classified into one of three frame types; intraframe (I-frame), predictive frame (P-frame) and bi-directional frame (B-frame), depending on compression degree and compression characteristic of the video frames. An I-frame, also known as an intra-coded frame or key-frame, is a single frame of digital content that a compressor examines independent of other preceding and/or following frames that stores all of the data needed to display that I-frame, but is the least compressible of the three types of frames. A P-frame, also known as a predictive frame or predicted frame, includes only the data that changes from the preceding I-frame (e.g., color, content changes, etc.). P-frames depend on the data from previous I-frames and P-frames to decompress (e.g., fill in most of the data) and are more compressible than I-frame. A B-frame, also known as a bi-directional frame or bi-directional predictive frame, utilize both previous and later I-frames and P-frames for data reference and get the highest amount of data compression. B-frames include one the data that changes from the preceding frame or is different from the data in the very next frame. In addition, studies show that 90% of the frames of a video are P-frames and B-frames, but account for less than 10% of the size of the video.

Considering the characteristics of I-, P- and B-frames, in the present disclosure, a video is separated into individual frames that are identified as I-frames and delta frames (i.e., P-frames and B-frames). The delta frames are physically separated and managed, such as for example, by storing the delta frames in a remote end. The physically separated and managed delta frames assist in protecting the safety of the video, but does not result in a loss of time (e.g., increased wait) while loading the delta frames from the remote end due to the small size of the P-frames and the B-frames.

As depicted in FIG. 4, in step S401, I-frames of the video are stored in first storage device 701. In step S401, the video is divided into I-frames, P-frames and B-frames. The I-frames of the video are stored in first storage device 701. Within first storage device 701, the video does not have to be a complete video; rather the video may be a portion of a complete video, such as a video segment.

In one embodiment, first storage device 701 may be a local storage device, so that the I-frames may be loaded and played directly from the local storage device in subsequent video playing. In another embodiment, first storage device 701 can be a cloud storage device in the remote end; however, the time to load the I-frames of larger sizes from the cloud storage device via the Internet when playing the video later will be longer than when stored in the local storage device.

In step S402, P-frames and B-frames of the video are stored in second 702 storage device that is separated from first storage device 701. In step S402, the P-frames and B-frames obtained by dividing the video are stored in second storage device 702. In one embodiment, second storage device 702 may be a cloud storage device different from first storage device 701. For example, the cloud storage device may be one of the storage devices included in the hardware and software layer 60 shown in FIG. 3. Since P-frames and B-frames constitute less than 10% of the total size of the video, the time associated with loading the P-frames and B-frames from the cloud storage device via the Internet when playing the video later does not result in a long wait time.

In another embodiment, second storage device 702 may include first sub-storage device 7021 and second sub-storage device 7022. The P-frames obtained by dividing the video may be stored in first sub-storage device 7021, while the B-frames may be stored in second sub-storage device 7022. In some other embodiment, first sub-storage device 7021 and second sub-storage device 7022 may be separated from each other, thus, the P-frames and B-frames may be stored separately in the cloud.

In one embodiment, to ensure data security, second storage device 702 may be a cloud storage device with an authentication service. For example, when playing the video later, a user requests to access second storage device 702. The cloud server verifies the access request and determines whether the user has access permission to second storage device 702. Only authenticated users can access second storage device 702 and load the P-frames and B-frames, and a user without access permission cannot access second storage device 702. As an example, the cloud server may be one of the hosts included in the hardware and software layer 60 shown in FIG. 3. In another embodiment, an independent cloud server is not necessary to perform the authentication; instead, second storage device 702 is configured to function to as the authentication for users.

In step S402 the P-frames and B-frames from the video are stored in second storage device 702 that is separated from first storage device 701. However, the P-frames and B-frames in second storage device 702 are associated with the I-frames stored in first storage device 701 in step S401. In order to show clear relationships between respective I-frames and respective P- and B-frames, for each I-frame stored in first storage device 701, reference information indicting the P-frames and B-frames associated with the I-frame may further be stored in first storage device 701, as explained by way of example within FIG. 5 (a)-(c).

FIG. 5(a) illustrates a common storage format of I-, P- and B-frames in a video. As shown in FIG. 5(a), in the video, each I-frame is followed by a plurality of associated P-frames and B-frames, which use the I-frame as a reference frame directly or indirectly. In the present embodiment, as shown in FIG. 5 (b), for each I frame ($I_1$, $I_2$, $I_3$ . . . ) stored in first storage device 701, corresponding reference information ($R_1$, $R_2$, $R_3$ . . . ) indicating sequential P-frames and B-frames associated with the I-frame are further stored. For example, FIG. 5(c) illustrates a mapping between the respective reference information and P- and B-frames with respect to the video illustrated in FIG. 5 (a). FIG. 5(b) merely illustrates an exemplary storage manner, and the reference information may be stored in any suitable location within the video instead of having to be stored immediately after the corresponding I-frame.

Alternatively, the reference information may include relevant data of the P-frames and B-frames associated with the I-frame. For example, the reference information may include one or more indications of a storage location of P-frames and B-frames in second storage device 702, a total size of the P-frames and B-frames, a starting time associated with the playing of the P-frames and B-frames in the video, or include other relevant descriptive information.

The method for storing the video according to the embodiment of the present disclosure has been described above in connection with FIGS. 4 and 5. In this embodiment, the I-frames and P-, B-frames are stored separately, and the P-, B-frames are stored in a private cloud storage device as an example. Thus, when users without a right to access the cloud storage device play the video in the local storage device, only the I-frames load, and the P- and B-frames containing more than 90% of the video content cannot load, thus ensuring the security of the video. However when access is authorized, due to the small size of the P-frames and B-frames, the time to load the P-frames and B-frames from the cloud storage device is greatly reduced when compared with the time associated with retrieving the whole video from the cloud, thus enhancing the user experience.

A description on playing the video stored according to the above described manner will be given below with reference to FIG. 6, which illustrates a flow chart of a method for playing a video according to an embodiment of the present disclosure.

Figure 6:
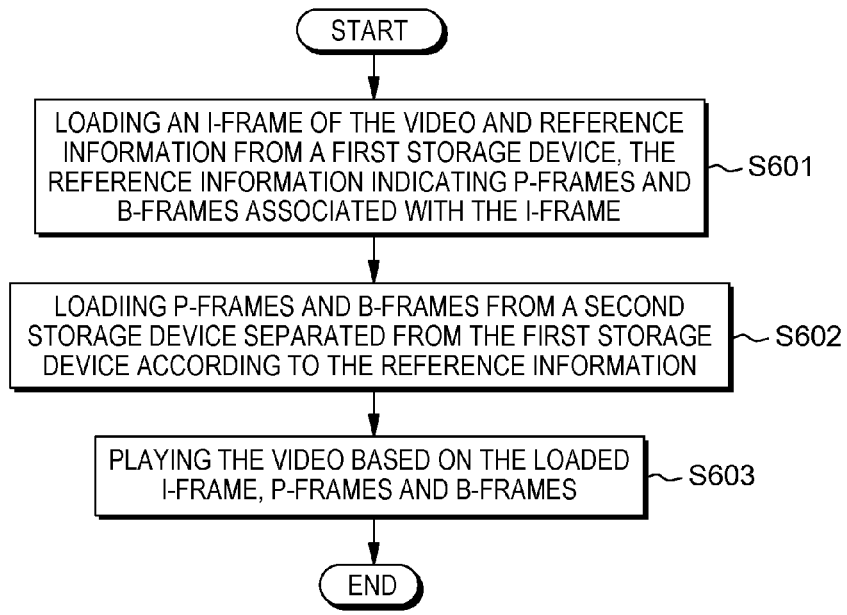
FIG. 6 illustrates a flow chart of a video playing method, in accordance with an embodiment of the present invention.

As shown in FIG. 6, in step S601, an I-frame of the video and reference information are loaded from first storage device 701, in which the reference information indicates P-frames and B-frames associated with the I-frame. The I-frame and the reference information corresponding to the I-frame are stored in first storage device 701, wherein the reference information indicates sequential P-frames and B-frames associated with the I-frame. In one embodiment, first storage device 701 may be a local storage device, then in step S601, the I-frame and the reference information are loaded in the local storage device. In another embodiment, first storage device 701 may also be a cloud storage device in a remote end, however, a longer time is associated with loading the I-frame and the reference information from the cloud storage device via the Internet than when stored in the local storage device.

In step S602, the P-frames and B-frames load from second storage device 702 that is separated from first storage device 701 based on the reference information. The P-frames and B-frames that should be loaded are determined based on the reference information, and load from second storage device 702. Second storage device 702 may be a cloud storage device separated from first storage device 701. Since the P-frames and B-frames have only less than 10% of the total size of the video, the time to load the P-frames and B-frames from the cloud storage device via the Internet is not long.

In another embodiment, the reference information includes an indication of a storage location of the P-frames and B-frames associated with the I-frame in second storage device 702, and in step S602, the P-frames and B-frames load directly from the storage location in second storage device 702 according to the indication.

In some other embodiment, second storage device 702 includes first sub-storage device 7021 and second sub-storage device 7022. First sub-storage device 7021 stores the P-frames, while second sub-storage device 7022 stores the B-frames. In an alternate embodiment, first sub-storage device 7021 and second sub-storage device 7022 may be separated from each other, thus, the P-frames and B-frames store separately in the cloud. Then in step S602, the P-frames and B-frames load from first sub-storage device 7021 and second sub-storage device 7022 based on the reference information, respectively.

In addition, in order to ensure data security, second storage device 702 may be a cloud storage device with an authentication service. Then in step S602, prior to loading from second storage device 702 authentication occurs. In one embodiment, the authentication may be performed by an independent cloud server. For example, in a case that a user requests to access second storage device 702, the access request will be verified by the independent cloud server to determine whether the user has access permission to second storage device 702. In another embodiment, second storage device 702 may be configured to authenticate users in place of the independent cloud server. In the case that the authentication passes, indicates the user requesting the loading has access permission, second storage device 702 may be accessed and the P-frames and B-frames load from the storage location in second storage device 702 based on the indication in the reference information.

In step S603, the video is played based on the loaded I-frame, P-frames and B-frames. In step S603, any conventional methods may be used to decode and play the loaded video frames, details are omitted herein.

The video playing method according to the embodiment of the present disclosure has been described in connection with FIG. 6. In this embodiment, I-frame and P-, B-frames are stored separately with P-, B-frames being stored in a private cloud storage device. Thus, when users without a right to access the cloud storage device play the video in the local storage device, only the I-frame loads, and the P- and B-frames containing more than 90% video content do not load, thus ensuring the security of the video. On the other hand, the P-frames and B-frames are of small size, so the time to load the P-frames and B-frames is greatly reduced as compared with placing the whole video in the cloud, and thus enhances the user experience.

It should be noted that the video may have one or more I-frames. For ease of description, an example that the video contains only one I-frame is described in the above embodiment. However, in the case that the video contains a plurality of I-frames, the video playing method described in the above embodiment is still applicable by performing the method for each I-frame and P-, B-frames associated therewith sequentially.

The respective embodiments for implementing the method of the present disclosure have been described with reference to the accompanying drawings hereinbefore. Those skilled in the art may understand that the above method may be implemented in software, in hardware, or in a combination thereof. Further, those skilled in the art may understand that by implementing the respective steps in the above method in software, in hardware, or in a combination thereof, a device for allocating data to a plurality of servers (or nodes) based on the same inventive concept may be provided. Even if a hardware configuration of the device is the same as that of a general-purpose processing device, the device will exhibit characteristics different from the general-purpose processing device due to a function of software contained therein, so as to form the device according to the embodiment of the present disclosure. The device of the present disclosure comprises a plurality of units or modules, which are configured to execute corresponding steps. Those skilled in the art may understand how to write a program to implement actions of the units or modules by reading the present specification.

Figure 7:
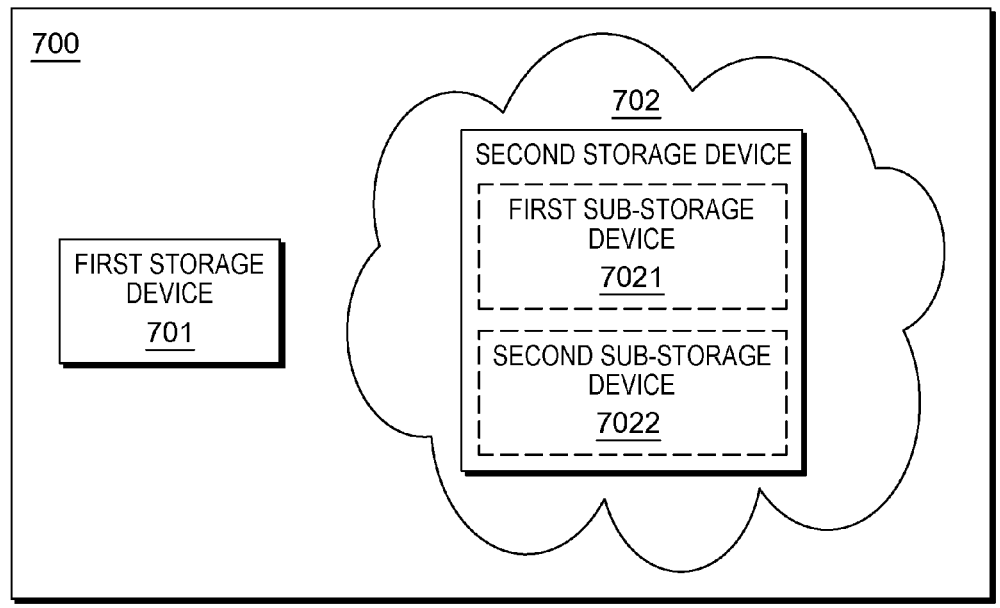
FIG. 7 illustrates a video storage system, in accordance with an embodiment of the present invention.

With reference now to FIG. 7, a video storage system, generally designated 700, in accordance with one embodiment of the present disclosure will be described. Since video storage system 700 and the method for storing the video described above are based on the same inventive concept, the same or corresponding implementation details in the above method are also applicable to video storage system 700, and the implementation details will not be described below because they have been described in the above in detail and completely.

As shown in FIG. 7, video storage system 700 according to one embodiment of the present disclosure includes first storage device 701 and second storage device 702.

First storage device 701 stores I-frames of the video. The video mentioned in the specification does not have to be a complete video, but may be a portion of the complete video, such as a video segment. In one embodiment, first storage device 701 may be a local storage device, so that I-frames may be loaded and played directly in later video playing. In another embodiment, first storage device 701 can also be a cloud storage device in a remote end, however, the time to load I-frames of large size from the cloud storage device via the Internet when playing the video later is longer than when loaded from the local storage device.

Second storage device 702 is separate from first storage device 701, and may store P-frames and B-frames of the video. In one embodiment, second storage device 702 may be a cloud storage device different from first storage device 701. Since the P- and B-frames have only less than 10% of the total size of the video, the time to load the P- and B-frames from the cloud storage device via the Internet when playing the video later is not long.

In another embodiment, second storage device 702 may comprise first sub-storage device 7021 and second sub-storage device 7022, in which P-frames are stored in first sub-storage device 7021, while B-frames are stored in second sub-storage device 7022. In some other embodiment, first sub-storage device 7021 and second sub-storage device 7022 may be separated from each other in the cloud.

To ensure data security, second storage device 702 may be a cloud storage device with an authentication service. Thus, in the later playing of the video, only authenticated users can access second storage device 702 and load the P-frames and B-frames, and user without access permission cannot access second storage device 702.

In one embodiment the P-frames and B-frames stored in second storage device 702 are associated with I-frames stored in first storage device 701. In order to identify clear relationships between respective I-frames and respective P- and B-frames, for each I-frame stored in first storage device 701, reference information indicting the P-frames and B-frames associated with the I-frame may further be stored in first storage device 701. Specifically, according to the common video storage format, each I-frame is followed by a plurality of associated P-frames and B-frames, which use the I-frame as a reference frame directly or indirectly. In the present embodiment, for each I-frame stored in first storage device 701, corresponding reference information indicating P-frames and B-frames associated with the I-frame are further stored.

In another embodiment, the reference information may include relevant data of the P-frames and B-frames associated with the I-frame. For example, the reference information may include one or more indications of a storage location of the P-frames and B-frames in second storage device 702, a total size of the P-frames and B-frames, a starting time associated with the playing of the P-frames and B-frames in the video, or include other relevant descriptive information.

Video storage system 700 according to an embodiment of the present disclosure has been described above in connection with FIG. 7. For example, the I-frames and P-, B-frames are stored separately, and the P-, B-frames are stored in a private cloud storage device. Thus, when users without a right to access the cloud storage device play the video in local storage, only the I-frames will be loaded, and the P- and B-frames containing more than 90% video content cannot be loaded, thus ensuring the security of the video. On the other hand, the P-frames and B-frames are of small size, so the time associated to load the P-frames and B-frames is greatly reduced as compared with placing the whole video in the cloud, and thus enhancing the user experience.

Figure 8:
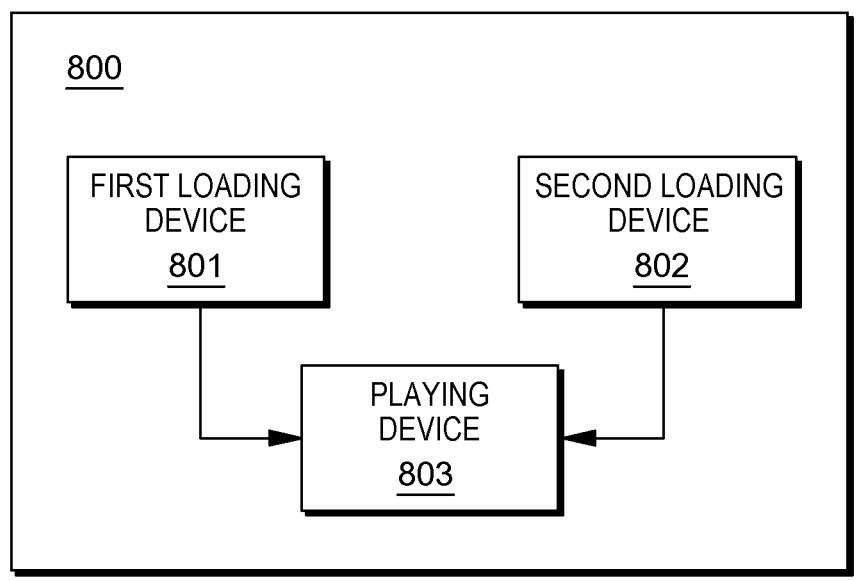
FIG. 8 illustrates a video playing device, in accordance with an embodiment of the present invention.

With reference now to FIG. 8, a video playing device 800 in accordance with an embodiment of the present disclosure will be described. Since video playing device 800 and the method for playing the video described above are based on the same inventive concept, the same or corresponding implementation details in the above method are also applicable to the video playing device 800, and the implementation details will not be described below because they have been described in the above in detail and completely.

As shown in FIG. 8, the video playing device 800 according to the embodiment of the present disclosure may include first loading device 801, second loading device 802, and playing device 803.

In one embodiment first loading device 801 may load an I-frame of the video and reference information from first storage device 701, in which the reference information indicates P-frames and B-frames associated with the I-frame. As described above, first storage device 701 may be a local storage device, then first loading device 801 may load the I-frame and the reference information in local storage. In another embodiment, first storage device 701 may also be a cloud storage device in a remote end, however, first loading device 801 spends a longer time loading the I-frame and the reference information from the cloud storage device via the Internet.

In another embodiment, second loading device 802 may load the P-frames and B-frames from second storage device 702 separated from first storage device 701 based on the reference information. Specifically, second loading device 802 determines which P-frames and B-frames should be loaded based on the reference information, and then loads the determined frames from second storage device 702. Second storage device 702 may be a cloud storage device separated from first storage device 701. Since the P-frames and B-frames have only less than 10% of the total size of the video, the time to load the P-frames and B-frames from the cloud storage device via the Internet is not as long.

In some other embodiment, the reference information includes an indication of a storage location of the P-frames and B-frames associated with the I-frame in second storage device 702, and the P-frames and B-frames can be loaded directly from the storage location in second storage device 702 according to the indication.

In yet another embodiment, second storage device 702 may include first sub-storage device 7021 and second sub-storage device 7022, and the P-frames are stored in first sub-storage device 7021, while the B-frames are stored in second sub-storage device 7022. In an alternate embodiment, first sub-storage device 7021 and second sub-storage device 7022 may be separated from each other, thus, the P-frames and B-frames may be stored separately in the cloud. The P-frames and B-frames may be loaded from first sub-storage device 7021 and second sub-storage device 7022 based on the reference information, respectively.

In addition, in order to ensure data security, second storage device 702 may be a cloud storage device with an authentication service. Then second loading device 802 needs to authenticate with second storage device 702 prior to loading from second storage device 702. When the authentication passes, thus indicating the user includes access permission to request the loading, second loading device 802 may load P-frames and B-frames from the storage location in second storage device 702 based on the indication in the reference information.

Playing device 803 plays the video based on the loaded I-frame, P-frames and B-frames. Playing device 803 may be any conventional video player, and thus a detailed description thereof is omitted here for simplicity.

Playing device 803 according to the embodiment of the present disclosure has been described above in connection with FIG. 8. In this embodiment, the I-frame and P-, B-frames are stored separately with P-, B-frames being stored in a private cloud storage device. Thus, when users without a right to access the cloud storage device play the video in the local storage device through playing device 803, only the I-frames will be loaded, and P- and B-frames that contain more than 90% of the video content cannot be loaded, ensuring the security of the video. On the other hand, the P-frames and B-frames are of small size, so the time to load the P-frames and B-frames is greatly reduced as compared with placing the whole video on the cloud, and thus enhances the user experience.

It should be noted that the video may have one or more I-frames. For ease of description within the example, the video contains only one I-frame as described in the present embodiment. However, playing device 803, as described in the present embodiment, is applicable for the video containing a plurality of I-frames.

The present invention may be a system, a method, and/or a computer program product. The computer program product may include a computer readable storage medium (or media) having computer readable program instructions thereon for causing a processor to carry out aspects of the present invention.

For example, a computer program product for storing a video may comprise a computer readable storage medium having thereon first program instructions and second program instructions. The first program instructions are executable by a processor to store I-frames of the video in first storage device 701. The second program instructions are executable by the processor to store P-frames and B-frames of the video in second storage device 702 that is separated from first storage device 701. In one embodiment, first storage device 701 may be a local storage device, and second storage device 702 may be a cloud storage device. In another embodiment, second storage device 702 may include first sub-storage device 7021 and second sub-storage device 7022, and the processor may be caused to store the P-frames in first sub-storage device 7021 and store the B-frames in second sub-storage device 7022. Additionally, the computer readable storage medium may have thereon third program instructions, which are executable by the processor to store in first storage device 701, for each of the I-frames, reference information indicting P-frames and B-frames associated with the I-frame. The reference information may further include an indication of a storage location of the P-frames and B-frames associated with the I-frame in second storage device 702.

As another example, a computer program product for playing a video may comprise a computer readable storage medium having thereon first program instructions, second program instructions and third program instructions. The first program instructions are executable by a processor to load an I-frame of the video and reference information from first storage device 701, the reference information indicates P-frames and B-frames associated with the I-frame. The second program instructions are executable by the processor to load the P-frames and B-frames from second storage device 702 that are separated from first storage device 701 based on the reference information. The third program instructions are executable by the processor to play the video based on the loaded I-frame, P-frames and B-frames. In one embodiment, first storage device 701 may be a local storage device, and second storage device 702 may be a cloud storage device. In another embodiment, second storage device 702 may include first sub-storage device 7021 and second sub-storage device 7022, and the processor may be caused to load the P-frames and B-frames from first sub-storage device 7021 and second sub-storage device 7022 based on the reference information, respectively. The reference information may further include an indication of a storage location of the P-frames and B-frames associated with the I-frame in second storage device 702. Second storage device 702 may be a cloud storage device with an authentication service, and the processor, when executing the second program instructions, may be caused to authenticate with second storage device 702, and load, if the authentication passes, the P-frames and B-frames load from the storage location in second storage device 702 according to the indication in the reference information.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer program product for storing frames of a video, the computer program product comprising one or more non-transitory computer readable storage media having program instructions therewith, the program instructions executable by a computer to cause the computer to:
    divide a video into one or more frames;
    identify a frame type associated with an individual frame within the divided one or more frames, wherein the identified frame type includes one of the following: an I-frame, a B-frame, and a P-frame;
    identify one or more I-frames within the divided one or more frames;
    identify reference information that indicates one or more P-frames and one or more B-frames associated with the identified one or more I-frame, and includes an indication of a storage device associated with the identified one or more P-frames and the identified one or more B-frames;
    store the identified one or more I-frames with the identified reference information on a first storage device of one or more storage devices, wherein the one or more storage devices comprise the first storage device and a second storage device that is separate from the first storage device and comprises a first sub-storage device and a second sub-storage device;
    identify one or more B-frames within the divided one or more frames;
    store the identified one or more B-frames on the second storage device of one or more storage devices;
    identify one or more P-frames within the divided individual frames;
    store the identified one or more P-frames on the second storage device of one or more storage devices;
    receive an indication to play the video;
    load an I-frame and associated reference information from the first storage device within the one or more storage devices based on the received indication;
    identify a request to load one or more B-frames and one or more P-frames from the second storage device of the one or more storage devices based on the loaded I-frame and associated reference information;
    determine whether the received request is authorized to load the one or more B-frames and the one or more P-frames from the second storage device of the one or more storage devices, wherein the second storage device includes one of the following: a cloud storage device with an authentication service and a configuration to authenticate the received request in place of an independent cloud server;

responsive to determining the received request is authorized, load the one or more B-frames and the one or more P-frames from one or more storage devices based on the associated reference information; and play the video based on the loaded I-frames, the one or more P-frames, and the one or more B-frames.

* * * * *